United States Patent [19]
Guenzer

[11] Patent Number: 5,478,653
[45] Date of Patent: Dec. 26, 1995

[54] BISMUTH TITANATE AS A TEMPLATE LAYER FOR GROWTH OF CRYSTALLOGRAPHICALLY ORIENTED SILICON

[76] Inventor: Charles S. Guenzer, 3852 Grove Ave., Palo Alto, Calif. 94303

[21] Appl. No.: 222,738

[22] Filed: Apr. 4, 1994

[51] Int. Cl.$^6$ ........................................................ B32B 9/04
[52] U.S. Cl. ........................ 428/446; 428/432; 428/688; 428/689; 428/697; 428/702; 257/295
[58] Field of Search ....................................... 428/688, 689, 428/697, 702, 428, 432, 210, 699, 446, 700; 437/83, 93; 148/DIG. 115; 257/295

[56] References Cited

U.S. PATENT DOCUMENTS

| | | | |
|---|---|---|---|
| 4,490,429 | 12/1984 | Toşaki | 428/195 |
| 4,888,246 | 12/1989 | Kuwata | 428/432 |
| 4,980,339 | 12/1990 | Setsune | 505/1 |
| 5,077,270 | 12/1991 | Takeda | 505/1 |
| 5,146,299 | 9/1992 | Lampe | 257/295 |
| 5,155,658 | 10/1992 | Inam et al. | 361/321 |
| 5,168,420 | 12/1992 | Ramesh et al. | 505/1 |
| 5,196,379 | 3/1993 | Weaver | 505/1 |
| 5,248,564 | 9/1993 | Ramesh | 428/688 |
| 5,270,298 | 12/1993 | Ramesh | 505/1 |
| 5,368,915 | 11/1994 | Ueda | 428/209 |

OTHER PUBLICATIONS

Sze, *Physics of Semiconductor Devices*, 2nd ed. (Wiley–Interscience, 1981), p. 848.

*Primary Examiner*—Ellis P. Robinson
*Assistant Examiner*—Leonidas J. Jones, III

[57] ABSTRACT

A method of forming a crystallographically oriented silicon layer over a glassy layer of, for example, $SiO_2$. A templating layer of a layered perovskite, preferably $Bi_4Ti_3O_{12}$, is deposited on the glassy layer under conditions favoring its crystallographic growth with its long c-axis perpendicular to the film. The silicon is then grown over the templating layer under conditions usually favoring monocrystalline growth. Thereby, it grows crystallographically aligned with the underlaying templating layer.

10 Claims, 1 Drawing Sheet

BISMUTH TITANATE AS A TEMPLATE LAYER FOR GROWTH OF CRYSTALLOGRAPHICALLY ORIENTED SILICON

FIELD OF THE INVENTION

The invention relates generally to the deposition of epitaxial silicon. In particular, the invention relates to the use of a perovskite material as a template layer to enable the growth of crystalline silicon over a glassy substrate.

BACKGROUND ART

Almost all commercial electronic integrated circuits rely upon active areas of singly crystalline silicon that, one way or another, are epitaxially connected to a singly crystalline silicon wafer. Most commonly, chemical vapor deposition (CVD) is used to epitaxially deposit silicon on a wafer consisting of a single crystalline region of silicon. The so deposited epitaxial and monocrystalline silicon film is thereafter processed into transistors or similar devices. However, a need has long existed to fabricate silicon transistors on glassy substrates or glassy intermediate layers.

In one approach, a layer of silicon is deposited over a glassy layer of silicon oxide. The deposited silicon is initially amorphous or polycrystalline, but annealing can make it form monocrystalline domains aligned with adjacent exposed crystalline regions of the underlying singly crystalline silicon substrate. One purpose for such a structure is to allow conduction only in the thin silicon surface layer, thereby preventing any parasitic interactions with the silicon substrate. In another approach, the silicon is deposited as a layer of high-quality amorphous silicon, and the amorphous silicon can be used as the active silicon region. This latter approach is used to form amorphous silicon transistors on glass substrates used for active-matrix flat panel displays.

However, the need remains to easily form singly crystalline silicon on disordered substrates or intermediate layers, such as silicon dioxide and silicate glasses.

Ramesh in U.S. Pat. No. 5,248,564 (the '564 patent) disclosed a powerful tool for the formation of crystallographically oriented metal oxides over a silicon dioxide ($SiO_2$) film. He found that bismuth titanate ($Bi_4Ti_3O_{12}$ or BTO) acts as an effective template for the overgrowth of crystallographically oriented metal oxides even when the BTO is grown on an amorphous $SiO_2$ layer. As Ramesh has explained in U.S. Pat. No. 5,270,298 (the '298 patent), bismuth titanate is one of a class of layered perovskites having two approximately perpendicular and approximately equal a- and b-lattice parameters, a=0.541 nm and b=0.545 nm, and a perpendicular but substantially long c-lattice parameter, c=3.28 nm. Films of the layered perovskites in general and of bismuth titanate in particular have a strong tendency to grow with the c-axis perpendicular to the growth plane of the film, even when the underlying layer is amorphous $SiO_2$. Thereafter, the metal oxide film is epitaxially deposited on the $Bi_4Ti_3O_{12}$ template layer. As explained in the '564 patent, the metal oxide, which has a nominally cubic crystallographic structure, is believed to deposit as a layer forming a crystallographic mosaic. That is, one of the three equal lattice vectors axes is strongly oriented in the vertical (z-axis) direction but the other two lattice vectors are distributed in the plane of the film surface in separate two-dimensional crystallites. Ramesh's work follows prior work described by Inam et al. in U.S. Pat. No. 5,155,658 (the '658 patent) and by Ramesh et al. in U.S. Pat. No. 5,168,420 (the '420 patent). These last two patents disclose the growth of crystalline ferroelectrics, including $Bi_4Ti_3O_{12}$, over crystalline perovskites. All four aforementioned patents are incorporated herein by reference.

SUMMARY OF THE INVENTION

The invention may be summarized as a method of forming crystallographically oriented silicon over a generally non-crystalline substrate. A template layer of a layered perovskite is formed over the substrate under conditions favoring the growth of the layered perovskite with its long c-axis perpendicular to the film. Then, silicon is deposited over the perovskite, and its crystallographic orientation follows that of the underlying template layer. Preferably the template layer is bismuth titanate, which has a- and b-axis lattice parameters closely matched to those of silicon. The top of the substrate may advantageously be composed of silicon dioxide.

DETAILED DESCRIPTION OF THE PREFERRED EMBODIMENT

Figure 1:
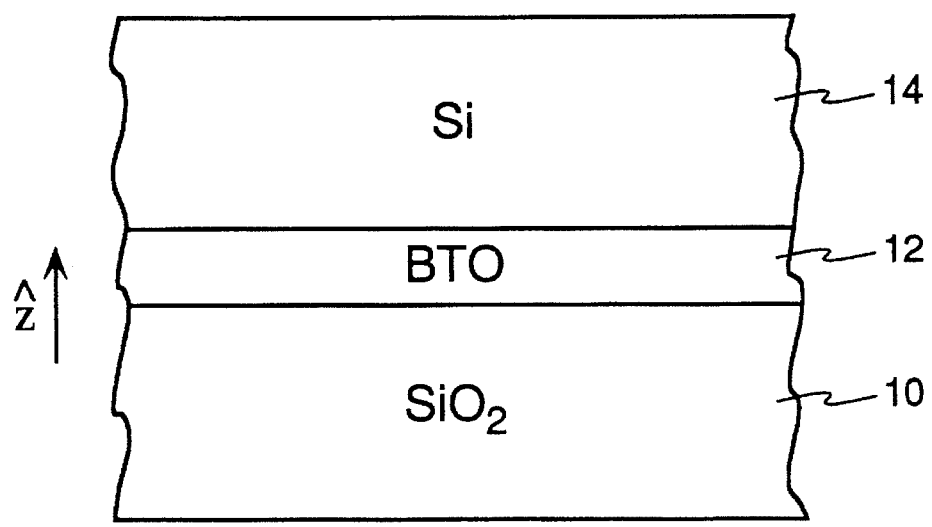
FIG. 1 is a cross-section of a first embodiment of the invention having a glassy substrate.

A first, basic embodiment of the invention, illustrated in cross section in FIG. 1, includes a substrate portion 10 of $SiO_2$, which is an amorphous or glassy insulator. A layer 12 of bismuth titanate ($Bi_4Ti_3O_{12}$ or BTO) is then deposited over the $SiO_2$ substrate portion 10 under conditions which promote the growth of BTO which is highly crystallographically oriented along the z-axis. Ramesh describes such growth conditions in the '564 patent and the target preparation in the '420 patent. The BTO layer 12 is intended to be a template layer which promotes the growth of crystallographically oriented material thereon. After the oriented BTO layer 12 has been formed, according to the invention, a layer 14 of silicon is deposited on the BTO layer 12 under such conditions that the silicon is epitaxial with the locally underlying BTO. Thereby, since the BTO has formed a mosaic crystalline structure, so also does the Si layer.

Ramesh has described in the '564 patent the crystallographically oriented growth of BTO over $SiO_2$ by pulsed laser ablation. Many processes are known for epitaxially depositing Si over a template layer, heretofore another crystalline Si layer. Most such processes involve CVD, whether at high or low temperature.

Crystallographically, BTO and Si are ideally matched. BTO has a perovskite crystal structure that is approximately rectangular. It has crystallographic a- and b-axis spacings of 0.541 and 0.545 nm within the growth plane and a c-axis spacing of 3.28 nm. On the other hand, crystallographically tetrahedral Si has a cubic lattice spacing of 0.543 nm, as tabulated by Sze in *Physics of Semiconductor Devices*, 2nd ed. (Wiley-lnterscience, 1981), p. 848. Thus, the a- and b-axes of BTO and Si can be made approximately congruent. Ramesh quantifies a desired congruency of the perovskite structure to a square lattice face in the '564 patent.

Chemically, Ramesh has shown in the '564 patent that crystallographically oriented BTO can be grown on $SiO_2$ and has an acceptable chemical interface therewith. The epitaxial growth of Si over BTO should present few problems and few variations from the usual processes for epitaxial silicon growth. This result demonstrates the chemical compatibility of BTO with silicon, at least in the presence of silicon oxides. Even if the silicon layer tends to leach oxygen from the BTO layer, the resulting amorphizing effect is exponentially attenuated over the thickness of the after grown Si layer. However, oxidization of the silicon can be minimized by using a low-temperature silicon deposition process, as is possible with plasma-enhanced chemical vapor deposition.

Although Ramesh used pulsed laser ablation to deposit the BTO, research is proceeding in the superconductivity field to deposit the perovskites using chemical vapor deposition (CVD). Then, both the BTO and the Si can be deposited in the same CVD chamber.

Figure 2:
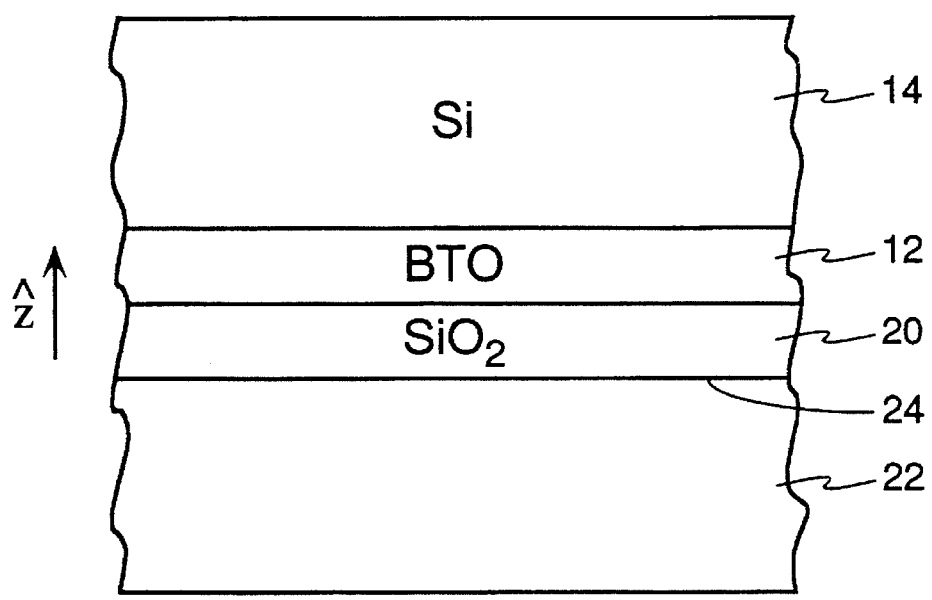
FIG. 2 is a cross-section of a second embodiment of the invention having a glassy film layer.

The embodiment of FIG. 1 assumes that the silica layer 10 composes a free-standing substrate. However, as illustrated in cross section in FIG. 2, a silica thin-film layer 20 can be formed over another substrate 22, which can be nearly freely chosen with only a few constraints based on chemical compatibility across an interface 24 between the two layers 20 and 22. The substrate 22 may be a crystalline silicon substrate, possibly with defined epitaxial layers formed thereon. In this case, the silica layer 20 may be used as insulating layer between at least partially oriented silicon areas. Such a structure allows multiple layers of active silicon devices. The substrate 22 may be another glassy material such as a borosilicate glass substrate commonly used for flat panel displays. It may also be another perovskite material, such as lithium niobate. Thereby, circuits utilizing crystallographically oriented silicon may be combined with circuits utilizing lithium niobate or similar material exhibiting a variety of piezo-electrical, acousto-optical, and other behavior.

The templating effect of the BTO layer 12 does not depend critically on the composition of the underlying glassy layer 10 or 22. The silicon oxide need not be stoichiometric $SiO_2$, and significantly different compositions are possible. Ramesh has given in the '564 patent some chemical considerations for the chemical compatibility of the templating layer and its underlying layer. Thus, within some general constraints (and these constraints can be often avoided by the use of intermediate buffer layers offering indirect compatibility), the crystallographical oriented templating layer may be formed over glassy layers of other compositions, e.g., directly over borosilicate glasses.

Furthermore, as Ramesh observed in the '564 patent, although bismuth titanate appears to be the best templating material, other layered perovskite materials having a metal-oxide composition and a substantially rectangular lattice cell also similarly orient crystallographically over a glassy layer and provide a template layer for the subsequent growth of crystallographically oriented silicon. A layered perovskite is defined in that patent. Inam et al. disclose many perovskites usable as templates including PrBaCuO.

The general concept of the invention can be extended from the oriented growth of Group IV compounds including silicon to the oriented growth of more complex compounds, such as the III-V and II-VI semiconductors tabulated by Sze at the previously cited page. The compound material is grown over a templating perovskite layer having similar a-and b-axis lattice constants and directly or indirectly exhibiting compatible chemistries. There are a large number of perovskites to choose from. Galasso provides an introduction to these materials in his text *Structure, Properties, and Preparation of Perovskite-type Compounds* (Pergammon, 1968), and the technical literature should be consulted for particular materials. Well's text cited in the '420 patent explains the different lattice perovskite crystal lattice structures, which need to be selected to match the zinc-blende structure of the III-V and II-VI semiconductors.

The invention thus provides an alternative technique for forming crystallographically oriented silicon over an amorphous or glassy substrate of a different composition. The technique can be performed at low temperatures and does not involve recrystallization of already deposited material. Although the resultant crystallographically oriented silicon does not have the very high quality of singly crystalline silicon, it will be better than polycrystalline silicon and transistors should be able to be formed therein.

What is claimed is:

1. A silicon heterostructure, comprising:
   a substrate having a glassy surface comprising a non-crystalline material;
   a templating layer comprising a layered perovskite deposited on said glassy surface to be crystallographically oriented with a long axis thereof substantially perpendicular to a principal plane of the layer; and
   a layer of silicon epitaxially deposited on said templating layer and substantially crystallographically aligned with said templating layer.

2. A silicon heterostructure as recited in claim 1, wherein said layered perovskite comprises bismuth, titanium, and oxygen.

3. A silicon heterostructure as recited in claim 2, wherein said layered perovskite comprises $Bi_4Ti_3O_{12}$.

4. A silicon heterostructure as recited in claim 1, wherein said glassy surface comprises a mixture of silicon and oxygen.

5. A silicon heterostructure as recited in claim 4, wherein said glassy surface is a glassy layer of said non-crystalline material deposited on said substrate and comprising said mixture of silicon and oxygen.

6. A silicon heterostructure as recited in claim 5, wherein said layered perovskite comprises bismuth, titanium, and oxygen.

7. A silicon heterostructure as recited in claim 6, wherein said layered perovskite comprises $Bi_4Ti_3O_{12}$.

8. A silicon heterostructure as recited in claim 1, wherein said substrate comprises a borosilicate glass.

9. A silicon heterostructure as recited in claim 8, wherein said glassy surface is a glassy layer of said non-crystalline material deposited on said substrate and comprises said mixture of silicon and oxygen.

10. A silicon heterostructure as recited in claim 9, wherein said mixture consists essentially of $SiO_2$.

* * * * *